(12) United States Patent
Hölzle et al.

(10) Patent No.: US 8,927,182 B2
(45) Date of Patent: Jan. 6, 2015

(54) PHOTOSENSITIVE RESIST COMPOSITION FOR COLOR FILTERS FOR USE IN ELECTRONIC PAPER DISPLAY DEVICES

(75) Inventors: Daniel Hölzle, Zofingen (CH); Gerardus De Keyzer, Riehen (CH); Liliana Craciun, Carmel, NY (US)

(73) Assignee: BASF SE, Ludwigshafen (DE)

( * ) Notice: Subject to any disclaimer, the term of this patent is extended or adjusted under 35 U.S.C. 154(b) by 1485 days.

(21) Appl. No.: 12/225,643

(22) PCT Filed: Mar. 21, 2007

(86) PCT No.: PCT/EP2007/052671
§ 371 (c)(1),
(2), (4) Date: Sep. 26, 2008

(87) PCT Pub. No.: WO2007/113107
PCT Pub. Date: Oct. 11, 2007

(65) Prior Publication Data
US 2010/0164911 A1    Jul. 1, 2010

(30) Foreign Application Priority Data

Mar. 30, 2006 (EP) .................................... 06111989
Aug. 18, 2006 (EP) .................................... 06119172

(51) Int. Cl.
| | |
|---|---|
| G03F 7/027 | (2006.01) |
| G03F 7/004 | (2006.01) |
| G03F 7/028 | (2006.01) |
| G03F 7/033 | (2006.01) |
| G03F 7/00 | (2006.01) |

(52) U.S. Cl.
CPC .............. *G03F 7/027* (2013.01); *G03F 7/0007* (2013.01)
USPC ............. 430/7; 430/270.1; 430/281.1; 522/6; 349/106

(58) Field of Classification Search
USPC .............. 430/7, 270.1, 281.1; 522/6; 349/106
See application file for complete search history.

(56) References Cited

U.S. PATENT DOCUMENTS

| 4,464,456 A | * | 8/1984 | Fujikawa et al. ........... 430/281.1 |
| 4,842,987 A | | 6/1989 | Elzer et al. ..................... 430/281 |
| 4,934,791 A | * | 6/1990 | Shimizu et al. ............... 349/107 |
| 4,970,134 A | | 11/1990 | Bronstert et al. ............. 430/271 |
| 4,985,343 A | | 1/1991 | Kushi et al. ................ 430/285.1 |
| 5,149,776 A | * | 9/1992 | Kushi et al. ................ 430/288.1 |

(Continued)

FOREIGN PATENT DOCUMENTS

| EP | 0 382 524 | 8/1990 |
| EP | 1 508 835 | 2/2005 |

(Continued)

OTHER PUBLICATIONS

JP 51040202 A, Apr. 1976, English Translation.*

(Continued)

*Primary Examiner* — Satya Sastri
(74) *Attorney, Agent, or Firm* — Shruti Costales

(57) ABSTRACT

The present invention relates to a photosensitive resist composition comprising a colorant. More specifically, it relates to a photosensitive resist composition which is advantageously used for the production of a color filter for use in electronic paper displays devices, color image pick-up elements and the like.

9 Claims, 1 Drawing Sheet

(56) References Cited

U.S. PATENT DOCUMENTS

| | | | |
|---|---|---|---|
| 6,344,299 B1 * | 2/2002 | Sato et al. | 430/7 |
| 2001/0009129 A1 * | 7/2001 | Kunita et al. | 101/453 |
| 2005/0095530 A1 | 5/2005 | Hosaka et al. | 430/270.1 |
| 2005/0208423 A1 | 9/2005 | Mitsumoto et al. | 430/270.1 |

FOREIGN PATENT DOCUMENTS

| | | | |
|---|---|---|---|
| EP | 1 577 090 | | 9/2005 |
| JP | 51040202 A | * | 4/1976 |
| JP | 10020490 A | * | 1/1998 |
| JP | 10-111566 | | 4/1998 |
| JP | 11338142 A | | 12/1999 |
| JP | 2001290265 A | | 10/2001 |
| JP | 2003253078 A | | 9/2003 |
| JP | 2003255120 A | | 9/2003 |
| JP | 2004163917 A | | 6/2004 |

OTHER PUBLICATIONS

JP 10020490 A, Jan. 1998, Machine Translation.*
Derwent abst. No. 1998-307481[27] of JP 10-111566.
Patent abstracts of Japan PN 2004083754 (Mar. 2004).
Patent abstracts of Japan PN 2003330184 (Nov. 2003).
English Language Abstract of JP 11338142 Dec. 10, 1999.
English Language Abstract of JP 2001290265 Oct. 19, 2001.
English Language Abstract of JP 2003253078 Sep. 10, 2003.
English Language Abstract of JP 2003255120 Sep. 10, 2003.
English Language Abstract of JP 2004163917 Jun. 10, 2004.

* cited by examiner

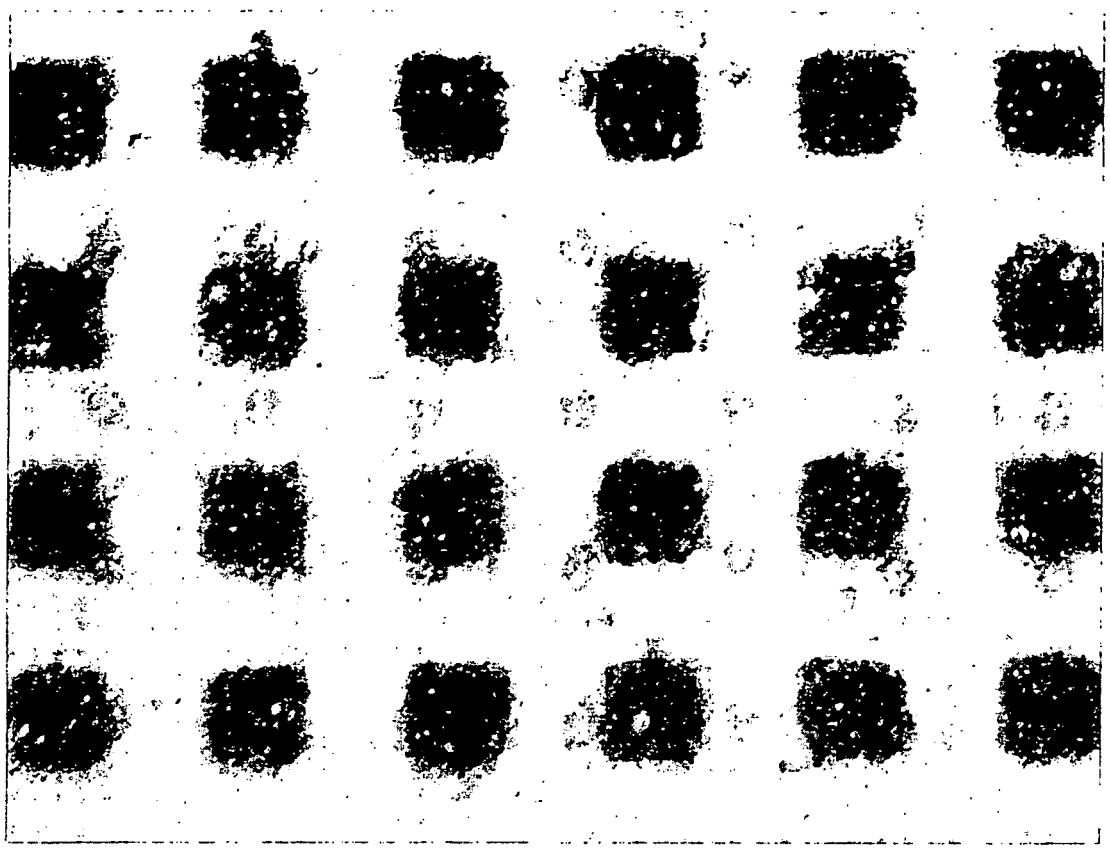

PHOTOSENSITIVE RESIST COMPOSITION FOR COLOR FILTERS FOR USE IN ELECTRONIC PAPER DISPLAY DEVICES

The present invention relates to a photosensitive resist composition, and more specifically, relates to a high sensitive photosensitive resist composition useful for forming colored filter segments such as red-, green-, blue-, yellow-, orange-, cyan- and magenta-colored filter segments and black matrices in a color filter useful in liquid crystal display devices and solid imaging elements. Further, the present invention relates to a color filter formed using the photosensitive resist composition and to the use of the thus formed color filter in electronic paper displays devices, color image pick-up elements and the like.

Electronic paper, or e-paper, is an emerging technology that allows the text on a piece of paper to be re-written. The "paper" is actually made of organic electronics that, use conductive plastic which contains tiny balls that respond to an electric charge, changing the page in much the same way that pixels change on a computer monitor.

Electronic paper overcomes some of the limitations of computer monitors. For example, the backlighting of monitors is hard on the human eye, whereas electronic paper reflects light just like normal paper. It is easier to read at an angle than flat screen monitors. Because it is made of plastic, electronic paper has the potential to be flexible. It is light and potentially inexpensive.

Electronic paper was first developed in the 1970s by Nick Sheridon at Xerox's Palo Alto Research Center. The first electronic paper, called Gyricon, consisted of tiny, statically charged balls that were black on one side and white on the other. The "text" of the paper was altered by, the presence of an electric field, which turned the balls up or down.

In the 1990s another type of electronic paper was invented by Joseph Jacobson. This used tiny microcapsules filled with electrically charged white particles suspended in a colored oil. In early versions, the underlying circuitry controls whether the white particles were at the top of the capsule (so it looked white to the viewer) or at the bottom of the capsule (so the viewer saw the color of the oil). This was essentially a reintroduction of the well-known electrophoretic display technology, but the use of microcapsules allowed the display to be used on flexible, plastic sheets instead of glass. There are many approaches to electronic paper, with many companies developing technology in this area. Other technologies being applied to electronic paper include modifications of liquid crystal displays, electrochromic displays, and the electronic equivalent of an Etch-A-Sketch at Kyushu University. One form or another of electronic paper is being developed by Gyricon (a spin-off of Xerox), Philips Electronics, Kent Displays (cholesteric displays), Ntera (electrochromic Nanochromic displays), and many others.

There is a need to develop a colored electronic paper display. In principle, there are two different ways to obtain a colored display. First, one can replace the white particles by coloured (RGB/CYM) particles and alternatively, by applying a color filter on top of the electronic paper display.

A rigid electronic paper display can use a color filter made on a separate glass substrate. However, this is an expensive approach and not easy to realize due to the necessary lamination of a second glass substrate with the color filter on top of the electronic paper display. A flexible electronic paper display cannot use this lamination method at all.

An alternative and cheaper method is to pattern the color filter directly on the electronic paper layer. A photosensitive resist composition is used to form a color filter. High sensitivity, adhesion to a substrate, chemical resistance and the like are required for the composition. In general, to form a color filter using such a photosensitive resist composition, a light screening layer pattern is formed on a transparent substrate, a photosensitive resist composition having a colorant dispersed therein is applied to the substrate, exposed to radiation through a photomask to be developed, and unexposed portions are dissolved with a developer to form a pixel pattern. Red, green and blue colorants are used as the colorant. Photosensitive resist compositions conventionally used comprise a resin containing an acidic functional group such as (meth) acrylic acid, a polyfunctional monomer such as pentaerythritol tri(meth)acrylate, and a photopolymerization initiator such as 1-hydroxycyclohexyl phenyl ketone.

However, with the existing color filter resists it is impossible to pattern the color filter directly on the electronic paper layer due to the fact that the resists need a final curing step at a temperature of at least 200° C. At this temperature the capsules containing the dispersion with the black and white particles will be completely destroyed. Omitting this postbake step is impossible with the current state-of-the-art resists. The photo-induced cross-linking of the acrylate monomer up to a degree of about 40-50% depending on the color is not enough for a sufficient chemical resistance against a second and a third layer in view of the fact that a color filter is built up out of three layers, R, G and B that are made sequential.

Color filter resist for low temperature applications are described for example, by Yoshimoto, Yasufumi in "Photocurable composition containing alkali-soluble resin, color filter using the composition, and formation of pattern using the composition", Jpn. Kokai Tokyo Koho (2004), JP-2004-083754 A2; and by Imamura, Naota in "Light-sensitive color resin composition for manufacturing color filters of liquid crystal displays", Jpn. Kokai Tokyo Koho (2003), JP-2003-330184 A2. However, the use of extra additives (epoxides, peroxides) in the resist to lower the curing temperature is essential. There is no hint that the heat curing step could be omitted.

It is an object of the present invention to provide a novel photosensitive resist composition for color filters.

Surprisingly, a solution was found by using selected diacrylate monomers which are more reactive, highly adherent but also more flexible than the acrylic monomers used in the prior art. By using those selected diacrylate monomers it is possible to already achieve a sufficient cross-linking degree of about 80% by photopolymerization and the resulting layer has a very good resistance against subsequent color filter resists. The use of those selected diacrylate monomers to achieve a higher cross-linking degree is compatible with the maintenance of physical properties such as superior dispersion stability, solubility and chemical resistance. The effect of leaving out the postbake step is obvious: No postbake reduces the amount of steps, making the manufacturing process cheaper. The biggest advantage, however, is that it is now possible to use low-temperature substrates.

It is an object of the present invention to provide a photosensitive resist composition which is suitable for the manufacture of a color filter in connection with low temperature applications.

It is still another object of the present invention to provide a photosensitive resist composition which is suitable for the production of a color filter for use in an electronic paper display device.

The other objects and advantages of the present invention will become apparent from the following description.

FIG. 1 shows a photograph wherein black squares form the target area and the gray dots are the inkjet droplets.

According to the present invention, firstly, the above objects and advantages of the present invention can be attained by a photosensitive resist composition which comprises (A) a diacrylate monomer of general formula (I)

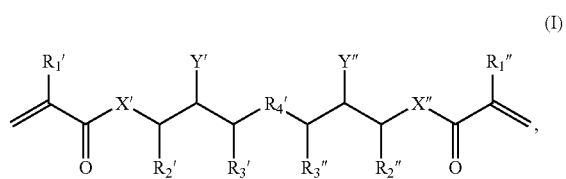

(I)

wherein
$R_1'$, $R_1''$, $R_2'$, $R_2''$, $R_3'$ and $R_3''$ are independently of each other H, $C_1$-$C_{18}$alkyl which can be substituted by E and/or interrupted by D, $C_6$-$C_{30}$aryl which can be substituted by E, $C_2$-$C_{30}$heteroaryl which can be substituted by E, —SR$^5$; —NR$^5$R$^6$;
$R_4'$ is $C_1$-$C_{18}$alkyl which can be substituted by E and/or interrupted by D;
D is —CO—, —COO—, —OCOO—, —S—, —SO—, —SO$_2$—, —O—, —NR$^5$—, or —POR$^5$—;
E is —OR$^5$, —SR$^5$, —NR$^5$R$^6$, —COR$^8$, —COOR$^7$, —CONR$^5$R$^6$, —CN, —OCOOR$^7$, or halogen;
R$^5$ and R$^6$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or R$^5$ and
R$^6$ together form a five or six membered ring,
R$^7$ is H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; $C_1$-$C_{18}$alkyl which is interrupted by —O—;
Y' and Y'' are independently of each other —OH or halogen; and
X' and X'' are independently of each other O or S.

Preferably, the inventive photosensitive resist composition comprises (A) a diacrylate monomer of general formula (II)

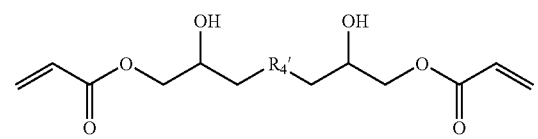

(II)

wherein
$R_4'$ is $C_1$-$C_{18}$alkyl which can be substituted by E and/or interrupted by D;
D is —CO—, —COO—, —OCOO—, —S—, —SO—, —SO$_2$—, —O—, —NR$^5$—, or —POR$^5$—;
E is —OR$^5$, —SR$^5$, —NR$^5$R$^6$, —COR$^8$, —COOR$^7$, —CONR$^5$R$^6$, —CN, —OCOOR$^7$, or halogen.

More preferably, the inventive photosensitive resist composition comprises (A) a diacrylate monomer which is selected from the group consisting of (1) Glycerol 1,3-diglycerolate diacrylate

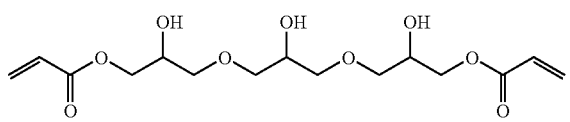 [SMILES: C=CC(=O)OCC(O)COCC(O)COCC(O)COC(=O)C=C]

(2) Ethylene glycol and poly(ethylene glycol) diglycerolate diacrylate Wherein n is an Integer of from 1 to 10

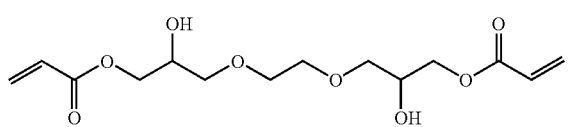

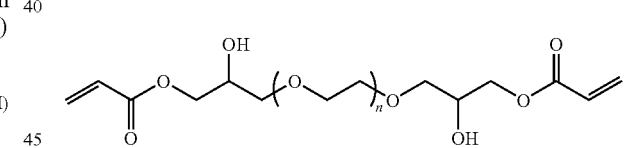

(3) Propoxylated ethylene glycol and poly(ethylene glycol) digycerolate diacrylate

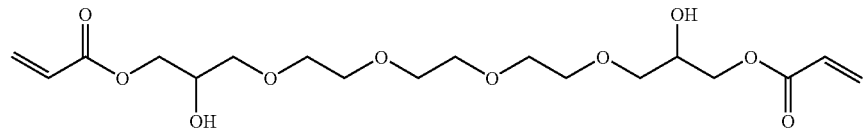

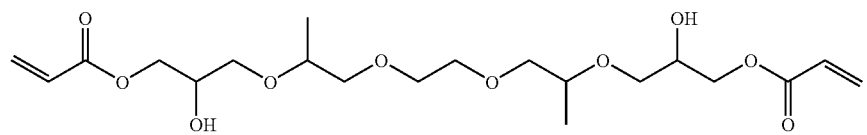

(4) 1,3-Propylene glycol and poly(propylene glycol) diglycerolate diacrylate Wherein n is an Integer of from 1 to 10

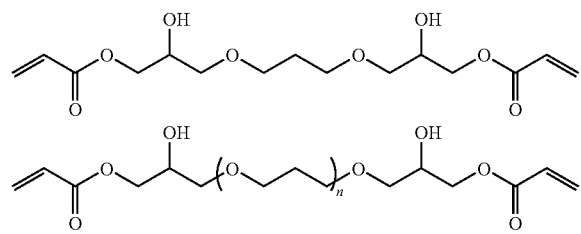

(5) 1,2-Propylene glycol diglycerolate diacrylate

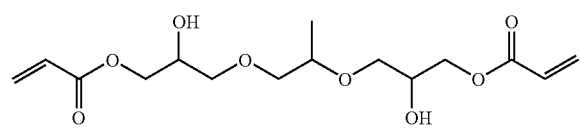 [SMILES: C=CC(=O)OCC(O)COCC(C)OCC(O)COC(=O)C=C]

(6) 1,4-Butylene glycol diglycerolate diacrylate

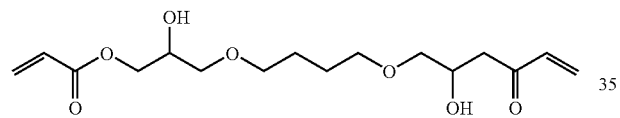

(7) 1,3-Butylene glycol diglycerolate diacrylate

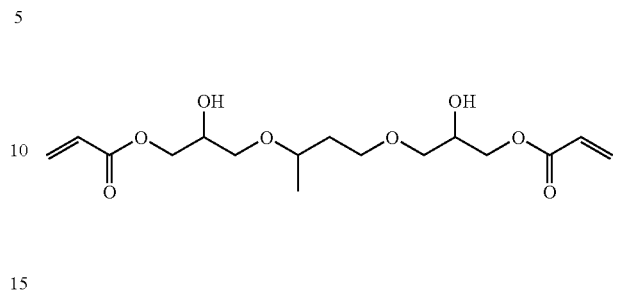

(8) Neopentyl glycol diglycerolate diacrylate

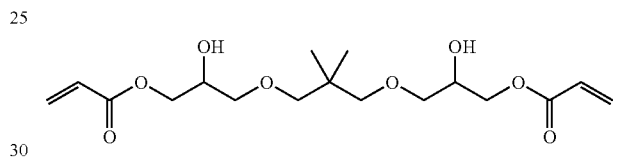

(9) 1,6-Hexanediol diglycerolate diacrylate

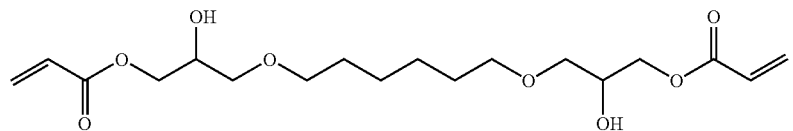 [SMILES: C=CC(=O)OCC(O)COCCCCCCOCC(O)COC(=O)C=C]

(10) 1,9-Nonanediol diglycerolate diacrylate

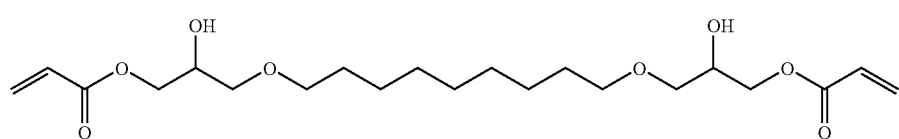 [SMILES: C=CC(=O)OCC(O)COCCCCCCCCCOCC(O)COC(=O)C=C]

(11) 1,4-Dimethanolcyclohexane diglycerolate diacrylate

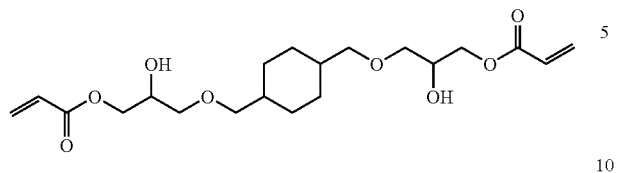

(12) Bisphenol A diglycerolate diacrylate

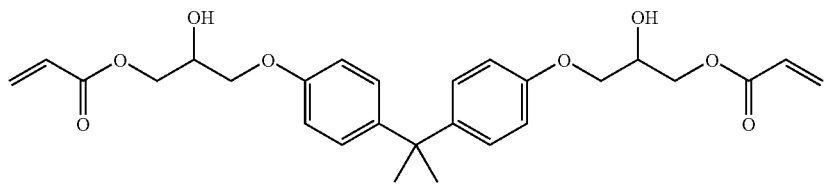 [SMILES: C=CC(=O)OCC(O)COc1ccc(C(C)(C)c2ccc(OCC(O)COC(=O)C=C)cc2)cc1]

(13) Ethoxylated bisphenol A diglycerolate diacrylate

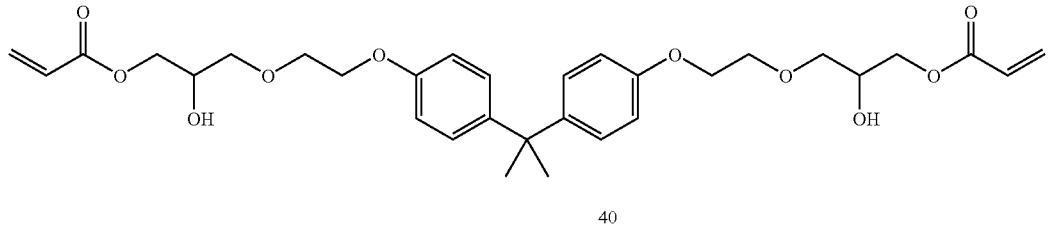

(14) Propoxylated bisphenol A diglycerolate diacrylate

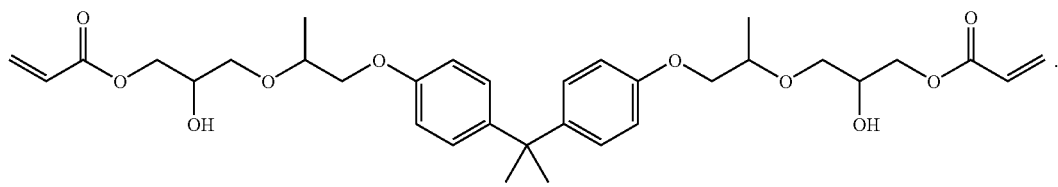 [SMILES: C=CC(=O)OCC(O)COC(C)COc1ccc(C(C)(C)c2ccc(OCC(C)OCC(O)COC(=O)C=C)cc2)cc1 ; "."]

It is especially preferred when glycerol 1,3-diglycerolate diacrylate is used as diacrylate monomer (A).

The diacrylate monomers mentioned hereinbefore can be synthesized from the corresponding diglycidyl ethers, of which most are commercially available. Other diacrylate monomers are commercially available, e.g. from Aldrich.

The above diacrylate monomers may be used alone or in admixture of two or more.

Monomers based on a polyglycerol derivative with acrylate groups at both ends of the monomer are known in literature as cross-linkers, mostly for printing plates. These materials have not been mentioned in connection with the manufacturing of color filters let alone that any hint is given in the art according to which they provide for the advantage of leaving out the final heating step for curing.

In a color filter resist the photo cross-linking is mostly done via radical polymerisation. A photoinitiator is irradiated and the generated radicals react with the double bonds of for example, a multifunctional (meth)acrylate monomer. The standard monomer is di(pentaerythritol) pentaacrylate with the following structure:

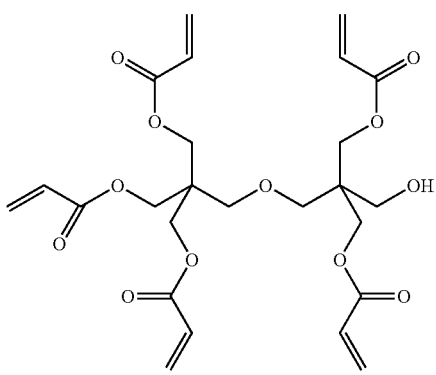 [SMILES: C=CC(=O)OCC(CO)(COCC(COC(=O)C=C)(COC(=O)C=C)COC(=O)C=C)COC(=O)C=C]

When using conventional monomers, for example the standard monomer di(pentaerythritol) pentaacrylate only a cross-linking degree of about 40-50% is achievable. However, further cross-linking can be achieved by performing a postbake of about 200° C., resulting in a cross-linking degree of 90-100%.

By changing the standard resist monomer with highly reactive acrylate monomers but with less functionality, of which the glycerol 1,3-diglycerolate diacrylate below is a preferred and representative example:

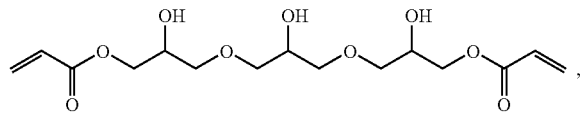 [SMILES: C=CC(=O)OCC(O)COCC(O)COCC(O)COC(=O)C=C ; ","]

a cross-linking degree of almost 80% can be reached which makes the postbake step superfluous.

Without the postbake this color filter manufacturing process can be used on organic foils without problems with irreversible thermal expansion or shrinkage and/or with the possible destruction of the capsules of an electronic paper display device.

Important parameters include but are not limited to the reactivity of the diacrylate monomer and the solubility of the non-polymerized monomer in the alkaline developer (tetramethoxy-ammonium hydroxide, NaHCO$_3$, etc).

Without wanting to be limited to any theory, both parameters are essentially determined by the number and the position of the hydroxyl groups in the monomer molecule. Hydroxyl groups improve the reactivity of the monomer and their conversion while also solubilizing the material in an alkaline medium. Thus, the structure of individual monomers strongly influences the rate and the extent of the photopolymerization reaction. Studies suggest that hydrogen bonding abilities enhance the overall polymerization rate via both monomer preorganization and inhibition of termination due to local viscosity effects. Hydroxylated systems exhibit significantly higher polymerization rates than typical monomers with increased overall conversions. See for example, Lee et al Polymer preprints 45(2), 49-50, 2004: Influence of hydrogen bonding on the photopolymerisation rates of mono- and multifunctional (meth)acrylates; Jansen, J. F. G. A.; Dias, A. A.; Dorschu, M.; Coussens, B. Macromolecules 2003, 36, 3861-3873; Dickens, S. H.; Stansbury, J. W.; Choi, K. M.; Floyd, C. J. E. Macromolecules 2003, 36, 6043-6053; and Mathias, L. J.; Shemper, B. S.; Alirol, M.; Morizur, J.-F. Macromolecules 2004, 37, 3231-3238. By analogy the tested monomers incorporate OH groups for maximum reactivity and optimum conversion.

The length of the spacer between the acrylate groups is also an important topological parameter. Bridge length affects monomer conformational mobility, critical to achieve pre-organization via hydrogen bonding, and resin properties. Generally, a flexible spacer with good adhesion is desired.

A second aspect of the present invention is to provide a photosensitive resist composition which comprises a diacrylate monomer (A) as described hereinbefore and which further comprises (B) a colorant; (C) a binder polymer; and (D) a photopolymerization initiator.

Preferably, the photosensitive resist composition comprises the binder polymer (C) in an amount of 10 to 1,000 parts by weight based on 100 parts by weight of the colorant (B), the diacrylate monomer (A) in an amount of 5 to 500 parts by weight based on 100 parts by weight of the binder polymer (C), and the photopolymerization initiator (D) in an amount of 0.01 to 200 parts by weight based on 100 parts by weight of the total of the diacrylate monomer (A).

The photosensitive resist composition preferably contains about 75% solvent, roughly 8% pigment stabilised with a suitable dispersant, 8% of a methacrylate binder (copolymer of a methacrylic acid and aliphatic and/or aromatic methacrylates), 8% of the diacrylate monomer as described hereinbefore and 1% of a photoinitiator, like Irgacure® 369 or other known and commercially available photoinitiators.

The colorant (B) in the present invention is not limited to a particular color and is suitably selected according to the application purpose of a color filter. It may be either organic or inorganic.

Preferably, the inventive photosensitive resist composition comprises a colorant (B) which is selected from the group consisting of an organic colorant and carbon black.

Illustrative examples of the organic colorant includes dyes, organic pigments, natural coloring matters and the like. Illustrative examples of the inorganic colorant include inorganic pigments, inorganic salts called "extender pigment" and the like. Since highly accurate color development and heat resistance are required for color filters, the colorant used in the present invention preferably has high color developing properties and high heat resistance, particularly high thermal decomposition resistance. An organic colorant and/or carbon black are/is generally used, and an organic pigment and/or carbon black is/are particularly preferred.

Examples of the organic pigment which can be used in the photosensitive composition of the present invention are shown below with color index numbers.

For a red colored composition for forming red filter segments, a red pigment such as C.I. Pigment Red 7, 9, 14, 41, 48:1, 48:2, 48:3, 48:4, 81:1, 81:2, 81:3, 97, 122, 123, 146, 149, 168, 177, 178, 180, 184, 185, 187, 192, 200, 202, 208, 210, 215, 216, 217, 220, 223, 224, 226, 227, 228, 240, 246, 254, 255, 264 or 272 can be used. A yellow pigment or an orange pigment can be additionally used in the red-colored composition.

For a yellow-colored composition for forming yellow filter segments, a yellow pigment such as C.I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 or 214 can be used.

For an orange-colored composition for forming orange filter segments, an orange pigment such as C.I. Pigment Orange 36, 43, 51, 55, 59, 61, 71 or 73 can be used.

For a green-colored composition for forming green filter segments, a green pigment such as C.I. Pigment Green 7, 10, 3.6 or 37 can be used. A yellow pigment can be additionally used in combination in the green-colored composition.

For a blue-colored composition for forming blue filter segments, a blue pigment such as C.I. Pigment Blue 15, 15:1, 15:2, 15:3, 15:4, 15:6, 16, 22, 60 or 64 can be used. A violet pigment such as C.I. Pigment Violet 1, 19, 23, 27, 29, 30, 32, 37, 40, 42 or 50 can be additionally used in the blue-colored composition.

For a cyan-colored composition for forming cyan filter segments, a blue pigment such as C.I. Pigment Blue 15:1, 15:2, 15:4, 15:3, 15:6, 16 or 81 can be used.

For a magenta-colored composition for forming magenta filter segments, a violet pigment and a red pigment such as C.I. Pigment Violet 1 and 19, and C.I. Pigment Red 144, 146, 177, 169 and 81 can be used. A yellow pigment can be additionally used in the magenta-colored composition.

Further, as a black colorant for black matrices, carbon black, titanium black, aniline black, an anthraquinone black pigment, a perylene black pigment, specifically, C.I. Pigment Black 6, 7, 12, 20, 31 or 32 can be used. Among these, carbon black is preferable. The surface of carbon black may be treated with, e.g., a resin.

Further, examples of inorganic pigment include titanium oxide, barium sulfate, zinc sulfide, lead sulfate, yellow lead, zinc yellow, red iron (III) oxide, cadmium red, navy blue, Prussian blue, chromium oxide green, cobalt green, amber, and synthetic iron black. The inorganic pigment is used in combination with the organic pigment for securing good coating property, sensitivity, developing property and the like while balancing chroma with brightness.

The photosensitive composition of the present invention can contain a dye for toning in an amount not lowering thermal resistance.

Of these inorganic colorants, carbon black is particularly preferred.

In the present invention, the above colorants may be used alone or in admixture of two or more.

The surface of each of these colorants may be modified with a polymer before use. The polymer for modifying the surface of the colorant is a polymer disclosed by JP-A 8-259876 (the term "JP-A" as used herein means an "unexamined published Japanese patent application"), commercial polymer or oligomer for dispersing a pigment, or the like. The description of JP-A 8-259876 is cited in the disclosure of the present invention.

The colorant in the present invention can be used in combination with a dispersant or dispersion aid as required.

Typical examples of the dispersant include polycarboxylates such as polyurethanes and polyacrylates; unsaturated polyamides; (partial) amine salts, ammonium salts and alkyl amine salts of polycarboxylic acids; polysiloxanes; long-chain polyaminoamide phosphates; hydroxyl group-containing polycarboxylates; and modified products thereof; amides formed by reacting polyesters having a free carboxylic acid group with poly(lower alkylene imines) and salts thereof; and the like, under the trade name of Disperbyk-130, 101, 161, 162, 163, 164, 165, 166, 170, 2000, 2001, 2050 and the like (of Byk Chemie Japan Co., EFKA 4046, 4047, 4050 4055, 4060, 4330, 4340 and the like (of EFKA Co., Ltd.), SOLSPERSE 13240, 13940, 17000, 24000 GR, 28000, 20000, 12000, 27000, 32000, 32500 and the like (of ZENEKA Co., Ltd.).

The dispersant or dispersion aid is, for example, a cationic, anionic, nonionic or amphoteric surfactant, or a silicone-based or fluorine-based surfactant.

Illustrative examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethyleneimines; and the like, under the trade name of KP (Shin-Etsu Chemical Co.), Polyflow (Kyoeisha Yushi Kagaku Kogyo Co.), F-Top (Tokem Products Co.), Megafax (Dainippon Ink & Chemicals Co.), Florade (Sumitomo 3M Co.), Asahi Guard and Surflon (Asahi Glass Co.), and the like.

These dispersants may be used alone or in admixture of two or more.

The dispersant is generally used in an amount of 50 parts or less by weight, preferably 0 to 30 parts by weight based on 100 parts by weight of the colorant.

The dispersant aid is a pigment derivative obtained by treating a pigment with an acid, base or polymer. Illustrative examples of the dispersant aid include blue pigment derivatives such as copper phthalocyanine derivatives; yellow pigment derivatives; and the like.

Any binder polymer (C) may be used as the binder polymer in the present invention as long as it serves as a binder for the colorant (B).

The binder polymer is a polymer containing an acidic functional group such as carboxyl group or phenolic hydroxyl group.

The binder polymer in the present invention is preferably a polymer containing a carboxyl group, particularly a copolymer (to be simply referred to as "carboxyl group-containing copolymer" hereinafter) of an ethylenically unsaturated monomer having at least one carboxyl group (to be simply referred to as "carboxyl group-containing unsaturated monomer" hereinafter) and other copolymerizable ethylenically unsaturated monomer (to be simply referred to as "other unsaturated monomer" hereinafter).

Illustrative examples of the carboxyl group-containing unsaturated monomer include unsaturated monocarboxylic acids such as acrylic acid, methacrylic acid, crotonic acid, .alpha.-chloroacrylic acid, ethacrylic acid and cinammic acid; unsaturated dicarboxylic acids (anhydrides) such as maleic acid, maleic anhydride, fumaric acid, itaconic acid, itaconic anhydride, citraconic acid, citraconic anhydride and mesaconic acid; unsaturated polycarboxylic acids (anhydrides) having at least three carboxyl groups in the molecule; mono(meth)acryloyloxyalkyl esters of non-polymerizable dicarboxylic acids such as mono(2-acryloyloxyethyl)ester of succinic acid, mono(2-methacryloyloxyethyl)ester of succinic acid, mono(2-acryloyloxyethyl)ester of phthalic acid and mono(2-methacryloyloxyethyl)ester of phthalic acid; .omega.-carboxy-polycaprolactone monoacrylate, .omega.-carboxy-polycaprolactone monomethacrylate and the like.

These carboxyl group-containing unsaturated monomers may be used alone or in admixture of two or more.

Illustrative examples of the other unsaturated monomer include aromatic vinyl compounds such as styrene, .alpha.-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, p-vinylbenzyl methyl ether and p-vinylbenzyl glycidyl ether; unsaturated carboxylates such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxytriethylene glycol acrylate and methoxytriethylene glycol methacrylate; unsaturated aminoalkyl carboxylates such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminoproyl acrylate, 2-dimethylaminopropyl methacrylate, 3-aminopropyl acrylate, 3-aminopropyl methacrylate, 3-dimethylaminopropyl acrylate and 3-dimethylaminopropyl methacrylate; unsaturated glycidyl carboxylates such as glycidyl acrylate and glycidyl methacrylate; vinyl carboxylates such as vinyl acetate, vinyl propionate, vinyl butyrate and vinyl benzoate; unsaturated ethers such as vinylmethyl ether, vinylethyl ether, allyl glycidyl ether and methallyl glycidyl ether; vinyl cyanide compounds such as acrylonitrile, methacrylonitrile, .alpha.-chloroacrylonitrile and vinylidene cyanide; unsaturated amides and unsaturated imides such as acrylamide, methacrylamide, .alpha.-chloroacrylamide, N-(2-hydroxyethyl)acrylamide, N-(2-hydroxyethyl)methacrylamide, maleimide, N-phenylmaleimide and N-cyclohexylmaleimide; aliphatic conjugated dienes such as 1,3-butadiene, isoprene and chloroprene; macromonomers having a monoacryloyl group or monomethacryloyl group at the terminal of a polymer molecular chain such as polystyrene, polymethyl acrylate, polymethyl methacrylate, poly-n-butyl acrylate, poly-n-butyl methacrylate and polysiloxane; and the like.

These other unsaturated monomers may be used alone or in admixture of two or more.

The proportion of the carboxyl group-containing unsaturated monomer in the carboxyl group-containing copolymer is generally 5 to 50 wt %, more preferably 10 to 40 wt %. When the proportion of the carboxyl group-containing unsaturated monomer is less than 5 wt %, the solubility in an alkali developer of the obtained radiation sensitive composition is liable to lower, while when the proportion is more than 50 wt %, the formed pixel pattern is apt to fall off from the substrate or the surface of the pixel is apt to be roughened at the time of development with an alkali developer.

Particularly, the carboxyl group-containing copolymer containing the carboxyl group-containing unsaturated monomer in the above specified proportion has excellent solubility in an alkali developer. In a radiation sensitive composition containing the copolymer as a binder, an undissolved product rarely remains after development with an alkali developer, stains or film residues are hardly produced in an area other than a portion of the substrate where pixels are formed, and a pixel pattern obtained from the composition is not dissolved excessively in the alkali developer, has excellent adhesion to the substrate and does not fall off from the substrate.

The carboxyl group-containing copolymer is particularly preferably a copolymer (to be referred to as "carboxyl group-containing copolymer (I)" hereinafter) of (1) a carboxyl group-containing unsaturated monomer comprising acrylic acid and/or methacrylic acid as an essential component, and mono(2-acryloyloxyethyl)ester of succinic acid and/or mono (2-mechacryloyloxyethyl)ester of succinic acid in some cases, and (2) at least one member selected from the group consisting of styrene, methyl acrylate, methyl methacrylate, 2-hydroxyethyl acrylate, 2-hydroxyethyl methacrylate, allyl (meth)acrylate, benzyl acrylate, benzyl methacrylate, phenyl acrylate, phenyl methacrylate, glycerol monoacrylate, glycerol monomethacrylate, N-phenylmaleimide, polystyrene macromonomer and polymethyl methacrylate macromonomer.

Illustrative examples of the carboxyl group-containing copolymer (I) include two-element and three-element copolymers (to be referred to as "carboxyl group-containing copolymers (Ia)" hereinafter) such as a copolymer of (meth) acrylic acid/benzyl (meth)acrylate, copolymer of (meth) acrylic acid/styrene/methyl (meth)acrylate, copolymer of (meth)acrylic acid/styrene/benzyl (meth)acrylate, copolymer of (meth)acrylic acid/methyl (meth)acrylate/polystyrene macromonomer, copolymer of (meth)acrylic acid/methyl (meth)acrylate/polymethyl methacrylate macromonomer, copolymer of (meth)acrylic acid/benzyl (meth)acrylate/polystyrene macromonomer, copolymer of (meth)acrylic acid/ benzyl (meth)acrylate/polymethyl methacrylate macromonomer, copolymer of (meth)acrylic acid/benzyl (meth) acrylate/2-hydroxyethyl (meth)acrylate, copolymer of (meth)acrylic acid/glycerol mono(meth)acrylate/benzyl (meth)acrylate, copolymer of (meth)acrylic acid/glycerol mono(meth)acrylate/phenyl (meth)acrylate, and copolymer of (meth)acrylic acid/glycerol mono(meth)acrylate/N-phenyl maleimide; four-element copolymers (to be referred to as "carboxyl group-containing copolymers (Ib)" hereinafter) such as a copolymer of (meth)acrylic acid/2-hydroxyethyl (meth)acrylate/benzyl (meth)acrylate/polystyrene macromonomer, copolymer of (meth)acrylic acid/2-hydroxyethyl (meth)acrylate/benzyl (meth)acrylate/polymethyl methacrylate macromonomer, copolymer of (meth)acrylic acid/styrene/benzyl (meth)acrylate/N-phenyl maleimide, copolymer of (meth)acrylic acid/styrene/phenyl (meth)acrylate/N-phenyl maleimide, copolymer of (meth)acrylic acid/ glycerol mono(meth)acrylate/styrene/benzyl (meth)acrylate, copolymer of (meth)acrylic acid/glycerol mono(meth)acrylate/styrene/phenyl (meth)acrylate, copolymer of (meth) acrylic acid/glycerol mono(meth)acrylate/styrene/N-phenyl maleimide, copolymer of (meth)acrylic acid/glycerol mono (meth)acrylate/methyl (meth)acrylate/benzyl (meth)acrylate, copolymer of (meth)acrylic acid/glycerol mono(meth) acrylate/methyl (meth)acrylate/phenyl (meth)acrylate, copolymer of (meth)acrylic acid/glycerol mono(meth)acrylate/methyl (meth)acrylate/N-phenyl maleimide, copolymer of (meth)acrylic acid/glycerol mono(meth)acrylate/2-hydroxyethyl (meth)acrylate/benzyl (meth)acrylate, copolymer of (meth)acrylic acid/glycerol mono(meth)acrylate/2-hydroxyethyl (meth)acrylate/phenyl (meth)acrylate, copolymer of (meth)acrylic acid/glycerol mono(meth)acrylate/2-hydroxyethyl (meth)acrylate/N-phenyl maleimide, copolymer of (meth)acrylic acid/glycerol mono(meth)acrylate/benzyl (meth)acrylate/phenyl (meth)acrylate, copolymer of (meth) acrylic acid/mono[2-(meth)acryloyloxyethyl]ester of succinic acid/glycerol mono(meth)acrylate/benzyl (meth)acrylate, copolymer of (meth)acrylic acid/glycerol mono(meth) acrylate/benzyl (meth)acrylate/N-phenyl maleimide, copolymer of (meth)acrylic acid/glycerol mono(meth)acrylate/benzyl (meth)acrylate/polystyrene macromonomer, copolymer of (meth)acrylic acid/glycerol mono(meth)acrylate/benzyl (meth)acrylate/polymethyl methacrylate macromonomer, copolymer of (meth)acrylic acid/mono[2-(meth)acryloyloxyethyl]ester of succinic acid/glycerol mono (meth)acrylate/phenyl (meth)acrylate, copolymer of (meth) acrylic acid/glycerol mono(meth)acrylate/phenyl (meth) acrylate/N-phenyl maleimide, copolymer of (meth)acrylic acid/glycerol mono(meth)acrylate/phenyl (meth)acrylate/ polystyrene macromonomer, copolymer of (meth)acrylic acid/glycerol mono(meth)acrylate/phenyl (meth)acrylate/ polymethyl methacrylate macromonomer, copolymer of (meth)acrylic acid/mono[2-(meth)acryloyloxyethyl]ester of succinic acid/glycerol mono(meth)acrylate/N-phenyl maleimide, copolymer of (meth)acrylic acid/glycerol mono(meth) acrylate/N-phenyl maleimide/polystyrene macromonomer, and copolymer of (meth)acrylic acid/glycerol mono(meth) acrylate/N-phenyl maleimide/polymethyl methacrylate macromonomer; five-element copolymers (to be referred to as "carboxyl group-containing copolymers (Ic)" hereinafter) such as a copolymer of (meth)acrylic acid/styrene/benzyl (meth)acrylate/N-phenyl maleimide/polystyrene macromonomer, copolymer of (meth)acrylic acid/styrene/benzyl (meth)acrylate/N-phenyl maleimide/polymethyl methacrylate macromonomer, copolymer of (meth)acrylic acid/styrene/phenyl (meth)acrylate/N-phenyl maleimide/polystyrene macromonomer, copolymer of (meth)acrylic acid/ styrene/phenyl (meth)acrylate/N-phenyl maleimide/ polymethyl methacrylate macromonomer, copolymer of (meth)acrylic acid/glycerol mono(meth)acrylate/styrene/ methyl (meth)acrylate/benzyl (meth)acrylate, copolymer of (meth)acrylic acid/glycerol mono(meth)acrylate/styrene/ methyl (meth)acrylate/phenyl (meth)acrylate, copolymer of (meth)acrylic acid/glycerol mono(meth)acrylate/styrene/ methyl (meth)acrylate/N-phenyl maleimide, copolymer of (meth)acrylic acid/glycerol mono(meth)acrylate/styrene/2-hydroxyethyl (meth)acrylate/benzyl (meth)acrylate, copolymer of (meth)acrylic acid/glycerol mono(meth)acrylate/styrene/2-hydroxyethyl (meth)acrylate/phenyl (meth)acrylate, copolymer of (meth)acrylic acid/glycerol mono(meth)acrylate/styrene/2-hydroxyethyl (meth)acrylate/N-phenyl maleimide, copolymer of (meth)acrylic acid/glycerol mono(meth) acrylate/styrene/benzyl (meth)acrylate/phenyl (meth) acrylate, copolymer of (meth)acrylic acid/mono[2-(meth) acryloyloxyethyl]ester of succinic acid/glycerol mono(meth) acrylate/styrene/benzyl (meth)acrylate, copolymer of (meth) acrylic acid/glycerol mono(meth)acrylate/styrene/benzyl (meth)acrylate/N-phenyl maleimide, copolymer of (meth) acrylic acid/glycerol mono(meth)acrylate/styrene/benzyl (meth)acrylate/polystyrene macromonomer, copolymer of (meth)acrylic acid/glycerol mono(meth)acrylate/styrene/ benzyl (meth)acrylate/polymethyl methacrylate macromonomer, copolymer of (meth)acrylic acid/mono[2-(meth)acryloyloxyethyl]ester of succinic acid/glycerol mono (meth)acrylate/styrene/phenyl (meth)acrylate, copolymer of (meth)acrylic acid/glycerol mono(meth)acrylate/styrene/ phenyl (meth)acrylate/N-phenyl maleimide, copolymer of (meth)acrylic acid/glycerol mono(meth)acrylate/styrene/ phenyl (meth)acrylate/polystyrene macromonomer, copolymer of (meth)acrylic acid/glycerol mono(meth)acrylate/styrene/phenyl (meth)acrylate/polymethyl methacrylate macromonomer, copolymer of (meth)acrylic acid/mono[2-(meth) acryloyloxyethyl]ester of succinic acid/glycerol mono(meth)acrylate/styrene/N-phenyl maleimide, copolymer of (meth)acrylic acid/glycerol mono(meth)acrylate/styrene/N-phenyl maleimide/polystyrene macromonomer, copolymer of (meth)acrylic acid/glycerol mono(meth)acrylate/styrene/N-phenyl maleimide/polymethyl methacrylate macromonomer, copolymer of (meth)acrylic acid/glycerol mono(meth)acrylate/methyl (meth)acrylate/2-hydroxyethyl (meth)acrylate/benzyl (meth)acrylate, copolymer of (meth) acrylic acid/glycerol mono(meth)acrylate/methyl (meth) acrylate/2-hydroxyethyl (meth)acrylate/phenyl (meth)acrylate, copolymer of (meth)acrylic acid/glycerol mono(meth) acrylate/methyl (meth)acrylate/2-hydroxyethyl (meth) acrylate/N-phenyl maleimide, copolymer of (meth)acrylic acid/glycerol mono(meth)acrylate/methyl (meth)acrylate/ benzyl (meth)acrylate/phenyl (meth)acrylate, copolymer of (meth)acrylic acid/mono[2-(meth)acryloyloxyethyl]ester of succinic acid/glycerol mono(meth)acrylate/methyl (meth) acrylate/benzyl (meth)acrylate, copolymer of (meth)acrylic acid/glycerol mono(meth)acrylate/methyl (meth)acrylate/ benzyl (meth)acrylate/N-phenyl maleimide, copolymer of (meth)acrylic acid/glycerol mono(meth)acrylate/methyl (meth)acrylate/benzyl (meth)acrylate/polystyrene macromonomer, copolymer of (meth)acrylic acid/glycerol mono (meth)acrylate/methyl (meth)acrylate/benzyl (meth)acrylate/polymethyl methacrylate macromonomer, copolymer of (meth)acrylic acid/mono[2-(meth)acryloyloxyethyl]ester of succinic acid/glycerol mono(meth)acrylate/methyl (meth) acrylate/phenyl (meth)acrylate, copolymer of (meth)acrylic acid/glycerol mono(meth)acrylate/methyl (meth)acrylate/ phenyl (meth)acrylate/N-phenyl maleimide, copolymer of (meth)acrylic acid/glycerol mono(meth)acrylate/methyl (meth)acrylate/phenyl (meth)acrylate/polystyrene macromonomer, copolymer of (meth)acrylic acid/glycerol mono (meth)acrylate/methyl (meth)acrylate/phenyl (meth)acrylate/polymethyl methacrylate macromonomer, copolymer of (meth)acrylic acid/mono[2-(meth)acryloyloxyethyl]ester of succinic acid/glycerol mono(meth)acrylate/methyl (meth) acrylate/N-phenyl maleimide, copolymer of (meth)acrylic acid/glycerol mono(meth)acrylate/methyl (meth)acrylate/N-phenyl maleimide/polystyrene macromonomer, copolymer of (meth)acrylic acid/glycerol mono(meth)acrylate/methyl (meth)acrylate/N-phenyl maleimide/polymethyl methacrylate macromonomer, copolymer of (meth)acrylic acid/glycerol mono(meth)acrylate/2-hydroxyethyl (meth)acrylate/ benzyl (meth)acrylate/phenyl (meth)acrylate, copolymer of (meth)acrylic acid/mono[2-(meth)acryloyloxyethyl]ester of succinic acid/glycerol mono(meth)acrylate/2-hydroxyethyl (meth)acrylate/benzyl (meth)acrylate, copolymer of (meth) acrylic acid/glycerol mono(meth)acrylate/2-hydroxyethyl (meth)acrylate/benzyl (meth)acrylate/N-phenyl maleimide, copolymer of (meth)acrylic acid/glycerol mono(meth)acrylate/2-hydroxyethyl (meth)acrylate/benzyl (meth)acrylate/ polystyrene macromonomer, copolymer of (meth)acrylic acid/glycerol mono(meth)acrylate/2-hydroxyethyl (meth) acrylate/benzyl (meth)acrylate/polymethyl methacrylate macromonomer, copolymer of (meth)acrylic acid/mono[2-(meth)acryloyloxyethyl]ester of succinic acid/glycerol mono (meth)acrylate/2-hydroxyethyl (meth)acrylate/phenyl (meth)acrylate, copolymer of (meth)acrylic acid/glycerol mono(meth)acrylate/2-hydroxyethyl (meth)acrylate/phenyl (meth)acrylate/N-phenyl maleimide, copolymer of (meth) acrylic acid/glycerol mono(meth)acrylate/2-hydroxyethyl (meth)acrylate/phenyl (meth)acrylate/polystyrene macromonomer, copolymer of (meth)acrylic acid/glycerol mono (meth)acrylate/2-hydroxyethyl (meth)acrylate/phenyl (meth)acrylate/polymethyl methacrylate macromonomer, copolymer of (meth)acrylic acid/mono[2-(meth)acryloyloxyethyl]ester of succinic acid/glycerol mono(meth)acrylate/2-hydroxyethyl (meth)acrylate/N-phenyl maleimide, copolymer of (meth)acrylic acid/glycerol mono(meth)acrylate/2-hydroxyethyl (meth)acrylate/N-phenyl maleimide/ polystyrene macromonomer, copolymer of (meth)acrylic acid/glycerol mono(meth)acrylate/2-hydroxyethyl (meth) acrylate/N-phenyl maleimide/polymethyl methacrylate macromonomer, copolymer of (meth)acrylic acid/mono[2-(meth)acryloyloxyethyl]ester of succinic acid/glycerol mono (meth)acrylate/benzyl (meth)acrylate/phenyl (meth)acrylate, copolymer of (meth)acrylic acid/glycerol mono(meth)acrylate/benzyl (meth)acrylate/phenyl (meth)acrylate/N-phenyl maleimide, copolymer of (meth)acrylic acid/glycerol mono (meth)acrylate/benzyl (meth)acrylate/phenyl (meth)acrylate/polystyrene macromonomer, copolymer of (meth)acrylic acid/glycerol mono(meth)acrylate/benzyl (meth)acrylate/phenyl (meth)acrylate/polymethyl methacrylate macromonomer, copolymer of (meth)acrylic acid/mono[2-(meth)acryloyloxyethyl]ester of succinic acid/glycerol mono (meth)acrylate/benzyl (meth)acrylate/N-phenyl maleimide, copolymer of (meth)acrylic acid/mono[2-(meth)acryloyloxyethyl]ester of succinic acid/glycerol mono(meth)acrylate/benzyl (meth)acrylate/polystyrene macromonomer, copolymer of (meth)acrylic acid/mono[2-(meth)acryloyloxyethyl]ester of succinic acid/glycerol mono(meth)acrylate/benzyl (meth)acrylate/polymethyl methacrylate macromonomer, copolymer of (meth)acrylic acid/glycerol mono (meth)acrylate/benzyl (meth)acrylate/N-phenyl maleimide/polystyrene macromonomer, copolymer of (meth)acrylic acid/glycerol mono(meth)acrylate/benzyl (meth)acrylate/N-phenyl maleimide/polymethyl methacrylate macromonomer, copolymer of (meth)acrylic acid/mono[2-(meth)acryloyloxyethyl]ester of succinic acid/glycerol mono(meth)acrylate/phenyl (meth)acrylate/N-phenyl maleimide, copolymer of (meth)acrylic acid/mono[2-(meth)acryloyloxyethyl]ester of succinic acid/glycerol mono(meth)acrylate/phenyl (meth)acrylate/polystyrene macromonomer, copolymer of (meth) acrylic acid/mono[2-(meth)acryloyloxyethyl]ester of succinic acid/glycerol mono(meth)acrylate/phenyl (meth)acrylate/polymethyl methacrylate macromonomer, copolymer of (meth)acrylic acid/glycerol mono(meth)acrylate/phenyl (meth)acrylate/N-phenyl maleimide/polystyrene macromonomer, copolymer of (meth)acrylic acid/glycerol mono(meth)acrylate/phenyl (meth)acrylate/N-phenyl maleimide/polymethyl methacrylate macromonomer, copolymer of (meth)acrylic acid/mono[2-(meth)acryloyloxyethyl]ester of succinic acid/glycerol mono(meth)acrylate/N-phenyl maleimide/polystyrene macromonomer, copolymer of (meth)acrylic acid/mono[2-(meth)acryloyloxyethyl]ester of succinic acid/glycerol mono(meth)acrylate/N-phenyl maleimide/polymethyl methacrylate macromonomer, copolymer of (meth)acrylic acid/N-phenyl maleimide/styrene/mono[2-(meth)acryloyloxyethyl]ester of succinic acid/benzyl (meth) acrylate, and copolymer of (meth)acrylic acid/N-phenyl maleimide/styrene/allyl (meth)acrylate/mono[2-(meth)acryloyloxyethyl]ester of succinic acid; and six-element copolymers (to be referred to as "carboxyl group-containing copolymers (Id)" hereinafter) such as a copolymer of (meth)acrylic acid/styrene/2-hydroxyethyl (meth)acrylate/benzyl (meth) acrylate/N-phenyl maleimide/polystyrene macromonomer, copolymer of (meth)acrylic acid/styrene/2-hydroxyethyl (meth)acrylate/benzyl (meth)acrylate/N-phenyl maleimide/polymethyl methacrylate macromonomer, copolymer of (meth)acrylic acid/styrene/2-hydroxyethyl (meth)acrylate/phenyl (meth)acrylate/N-phenyl maleimide/polystyrene macromonomer, and copolymer of (meth)acrylic acid/styrene/2-hydroxyethyl (meth)acrylate/phenyl (meth)acrylate/N-phenyl maleimide/polymethyl methacrylate macromonomer.

The carboxyl group-containing copolymers (I) may be used alone or in admixture of two or more. In the present invention, at least one other binder polymer may be used in conjunction with the carboxyl group-containing copolymer (I) in some cases.

The binder polymer preferably has a weight average molecular weight in terms of polystyrene measured by gel permeation chromatography (GPC: tetrahydrofuran as a solvent) (to be simply referred to as "weight average molecular weight" hereinafter) of 3,000 to 300,000, more preferably 5,000 to 100,000. The ratio of the weight average molecular weight to the number average molecular weight is preferably 1 to 5, more preferably 1.5 to 4, much more preferably 2 to 3.5.

By using the binder polymer having such specific weight average molecular weight, a radiation sensitive composition having excellent developability can be obtained, whereby a pixel array having a sharp pattern edge can be formed, and stains, film residues or the like are hardly produced in an area other than a portion of the substrate where pixels are formed at the time of development.

The amount of the binder polymer used in the present invention is generally 10 to 1,000 parts by weight, preferably 20 to 500 parts by weight based on 100 parts by weight of the colorant (B).

The term "photopolymerization initiator (D)" as used in the present invention means a compound which forms radical, cationic or anionic active species capable of starting the polymerization of component (A) due to the decomposition or cleavage of a bond caused by exposure.

The photopolymerization initiator is a compound having a biimidazole ring, benzoin-based compound, acetophenone-based compound, benzophenone-based compound, .alpha.-diketone-based compound, polynuclear quinone-based compound, xanthone-based compound, or triazine-based compound (to be referred to as "compound having a biimidazole ring or the like" hereinafter).

Illustrative examples of the biimidazole-based compounds (1) and the biimidazole-based compounds (2) are as follows.

The biimidazole-based compounds (1) include 2,2'-bis(2-chlorophenyl)-4,4',5,5'-tetrakis(4-methoxycarbonylphenyl)-1,2'-biimidazole, 2,2'-bis(2-chlorophenyl)-4,4',5,5'-tetrakis(4-ethoxycarbonylphenyl)-1,2'-biimidazole, 2,2'-bis(2-chlorophenyl)-4,4',5,5'-tetrakis(4-phenoxycarbonylphenyl)-1,2'-biimidazole, 2,2'-bis(2,4-dichlorophenyl)-4,4',5,5'-tetrakis(4-methoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-methoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-cyanophenyl)-4,4,'5,5'-tetrakis(4-methoxycarbonylphenyl)-1,2'-biimidazole, 2,2'-bis(2-cyanophenyl)-4,4,'5,5'-tetrakis(4-ethoxycarbonylphenyl)-1,2'-biimidazole, 2,2'-bis(2-cyanophenyl)-4,4',5,5'-tetrakis(4-phenoxycarbonylphenyl)-1,2'-biimidazole, 2,2'-bis(2-methylphenyl)-4,4'5,5'-tetrakis(4-methoxycarbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methylphenyl)-4,4',5,5'-tetrakis(4-phenoxycarbonylphenyl)-1,2'-biimidazole, 2,2'-bis(2-ethylphenyl)-4,4',5,5'-tetrakis(4-methoxycarbonylphenyl)-1,2'-biimidazole, 2,2'-bis(2-ethylphenyl)-4,4',5,5'-tetrakis(4-ethoxycarbonylphenyl)-1,2'-biimidazole, 2,2'-bis(2-ethylphenyl)-4,4',5,5'-tetrakis(4-phenoxycarbonylphenyl)-1,2'-biimidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis(2-phenylphenyl)-4,4',5,5'-tetrakis(4-phenoxycarbonylphenyl)-1,2'-biimidazole, and the like.

The bimidazole-based compounds (2) include 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2,4-dimethylphenyl)-4,4',5,5'-tetraphenyl-1,2'-biimidazole, 2,2'-bis(2,4,6-trimethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1,2'-biimidazole, 2,2'-bis(2,4-diphenylphenyl)-4,4',5,5'-tetraphenyl-1,2'-biimidazole, 2,2'-bis(2,4,6-triphenylphenyl)-4,4',5,5'-tetraphenyl-1,2'-biimidazole, and the like.

Of these, particularly preferred biimidazole-based compounds (1) are 2,2'-bis(2-chlorophenyl)-4,4',5,5'-tetrakis(4-ethoxycarbonylphenyl)-1,2'-biimidazole and 2,2'-bis(2-bromophenyl)-4,4',5,5'-tetrakis(4-ethoxycarbonyphenyl)-1,2'-biimidazole. Of these, particularly preferred biimidazole-based compound (2) are 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-biimidazole.

The biimidazole-based compounds (1) and the biimidazole-based compounds (2) have excellent solubility in a solvent and does not produce foreign matter such as undissolved product and deposit. In addition, they have high sensitivity, fully promote a curing reaction by exposure with a small amount of energy, provide high contrast and are free from a curing reaction in an unexposed portion. Therefore, the exposed coating films of these compounds are clearly divided into cured portions insoluble in a developer and uncured portions highly soluble in the developer, thereby making it possible to form a color filter having no partial or complete loss or undercut of a pixel pattern.

Illustrative examples of the benzoin-based compound include benzoin, benzoin methylether, benzoin ethylether, benzoin i-propylether, benzoin i-butylether, methyl-2-benzoyl benzoate and the like.

Illustrative examples of the acetophenone-based compound include 2,2-dimethoxy-2-phenylacetophenone, 2-hydroxy-2-methyl-1-phenylpropan-1-one, 1-(4-i-propylphenyl)-2-hydroxy-2-methylpropan-1-one, 4-(2-hydroxyethoxy)phenyl-(2-hydroxy-2-propyl)ketone, 2,2-dimethoxyacetophenone, 2,2-diethoxyacetophenone, 2-methyl-(4-methylthiophenyl)-2-morpholino-1-propan-1-one, 2-benzyl-2-dimethylamino-1-(4-morpholinophenyl)butan-1-one, 1-hydroxycyclohexylphenyl ketone, 2,2-dimethoxy-1,2-diphenylethan-1-one and the like.

Illustrative examples of the benzophenone-based compound include 4,4'-bis(dimethylamino)benzophenone, 4,4'-bis(diethylamino)benzophenone and the like.

Illustrative examples of the .alpha.-diketone-based compound include diacetyl, dibenzoyl, methylbenzoyl formate and the like.

Illustrative examples of the polynuclear quinone-based compound include anthraquinone, 2-ethylanthraquinone, 2-t-butylanthraquinone, 1,4-naphthoquinone and the like.

Illustrative examples of the xanthone-based compound include xanthone, thioxanthone, 2-chlorothioxanthone and the like.

Illustrative examples of the triazine-based compound include 1,3,5-tris(trichloromethyl)-s-triazine, 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'-methoxyphenyl)-s-triazine, 2-(2'-furylethylidene)-4,6-bis(trichloromethyl)-s-triazine, 2-(4'-methoxystyryl)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, 2-(2'-thiophenylethylidene)-4,6-bis(trichloromethyl)-s-triazine and the like.

Of the above benzoin-based compounds, acetophenone-based compounds, benzophenone-based compounds, .alpha.-diketone-based compounds, polynuclear quinone-based compounds, xanthone-based compounds and triazine-based compounds (to be referred to as "benzoin-based compounds and the like" hereinafter), 2-hydroxy-2-methyl-1-phenylpropan-1-one, 2-methyl-(4-methylthiophenyl)-2-morpholino-1-propan-1-one and 2-benzyl-2-dimethylamino-1-(4-morpholinophenyl)butan-1-one are preferred because the formed pixel pattern hardly falls off from the substrate at the time of development and the pixel strength and sensitivity are high.

In the present invention, the compounds having a biimidazole ring and the like may be used alone or in combination of two or more.

In the present invention, the compound having a biimidazole ring or the like can be used in combination with at least one member selected from the group consisting of a sensitizer, a curing promoting agent and a photo-crosslinking agent or photosensitizer composed of a polymer compound as required (to be referred to as "polymer photo-crosslinking/sensitizing agent" hereinafter).

Illustrative examples of the sensitizer include 4,4'-bis(dimethylamino)benzophenone, 4,4'-bis(diethylamino)benzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal)cyclohexanone, 7-diethylamino-3-(4-diethylaminobenzoyl)coumarin, 4-(diethylamino)chalcone and the like.

Illustrative examples of the curing promoting agent include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole, 3-mercapto-4-methyl-4H-1,2,4-triazole and the like.

Further, the polymer photo-crosslinking/sensitizing agent is a polymer compound having a functional group which can function as a photo-crosslinking agent and/or photosensitizing agent in the main chain and/or side chain. Illustrative examples of the polymer photo-crosslinking/sensitizing agent include a condensate of 4-azidobenzaldehyde and polyvinyl alcohol, condensate of 4-azidobenzaldehyde and phenol novolak resin, homopolymer and copolymer of 4-acryloylphenylcinnamoyl ester, 1,4-polybutadiene, 1,2-polybutadiene and the like.

Of the above sensitizers, curing promoting agents and polymer photo-crosslinking/sensitizing agents, 4,4'-bis(dimethylamino)benzophenone, 4,4'-bis(diethylamino)benzophenone and 2-mercaptobenzothiazole are preferred because the formed pixel pattern hardly falls off from the substrate at the time of development and the pixel strength and sensitivity are high.

In the present invention, the photopolymerization initiator is particularly preferably a combination of at least one selected from the group consisting of the biimidazole-based compounds (1) and the biimidazole-based compounds (2), and an acetophenone-based compound and/or a benzophenone-based compound.

Particularly preferred examples of the above combination include a combination of 2,2'-bis(2-chlorophenyl)-4,4',5,5'-tetrakis(4-ethoxycarbonylphenyl)-1,2'-biimidazole/4,4'-bis(diethylamino)benzophenone; a combination of 2,2'-bis(2-chlorophenyl)-4,4',5,5'-tetrakis(4-ethoxycarbonylphenyl)-1,2'-biimidazole, 4,4'-bis(diethylamino)benzophenone/2-benzyl-2-dimethylamino-1-(4-morpholinophenyl)butan-1-one; a combination of 2,2'-bis(2-chlorophenyl)-4,4',5,5'-tetrakis(4-ethoxycarbonylphenyl)-1,2'-biimidazole/4,4'-bis(diethylamino)benzophenone/1-hydroxycyclohexylphenyl ketone; a combination of 2,2'-bis(2-chlorophenyl)-4,4',5,5'-tetrakis(4-ethoxycarbonylphenyl)-1,2'-biimidazole/4,4'-bis(dimethylamino)benzophenone/1-hydroxycyclohexylphenyl ketone/2-mercaptobenzothiazole; a combination of 2,2'-bis(2,4-dichlorophenyl)-4,4',5,5'-tetraphenyl-1,2'-biimidazole/4,4'-bis(diethylamino)benzophenone; a combination of 2,2'-bis(2,4-dibromophenyl)-4,4',5,5'-tetraphenylbi-1,2'-biimidazole/4,4'-bis(diethylamino)benzophenone/2-benzyl-2-dimethylamino-1-(4-morpholinophenyl)butan-1-one; a combination of 2,2'-bis(2,4-dibromophenyl)-4,4',5,5'-tetraphenylbi-1,2'-biimidazole/4,4'-bis(diethylamino)benzophenone/1-hydroxycyclohexylphenyl ketone; a combination of 2,2'-bis(2,4-dichlorophenyl)-4,4',5,5'-tetraphenyl-1,2'-biimidazole/4,4'-bis(diethylamino)benzophenone/2-benzyl-2-dimethylamino-1-(4-morpholinophenyl)butan-1-one/2-mercaptobenzothiazole; a combination of 2,2'-bis(2,4,6-trichlorophenyl)-4,4',5,5'-tetraphenyl-1,2'-biimidazole/4,4'-bis(dimethylamino)benzophenone/1-hydroxycyclohexylphenyl ketone/2-mercaptobenzothiazole; and a combination of 2,2'-bis(2,4-dichlorophenyl)-4,4',5,5'-tetraphenyl-1,2'-biimidazole/2-benzyl-2-dimethylamino-1-(4-morpholinophenyl)butan-1-one.

In the present invention, the total amount of the benzoin-based compound and the like is preferably 80 wt % or less based on the whole amount of the photopolymerization initiator, the total amount of the sensitizer and the curing promoting agent is preferably 80 wt % or less based on the whole amount of the photopolymerization initiator, and the amount of the polymer photo-crosslinking/sensitizing agent is generally 200 parts or less by weight, preferably 0.01 to 200 parts by weight, more preferably 50 to 180 parts by weight based on 100 parts by weight of the total of the biimidazole-based compound (1) and the biimidazole-based compound (2).

The amount of the photopolymerization initiator in the present invention is generally 0.01 to 200 parts by weight, preferably 1 to 120 parts by weight, particularly preferably 1 to 50 parts by weight based on 100 parts by weight of the total of component (A). When the amount of the photopolymerization initiator is smaller than 0.01 part by weight, curing by exposure is insufficient with the result that a pixel pattern may be partially or completely lost or undercut. On the other hand, when the amount is larger than 200 parts by weight, the formed pixel pattern easily falls off from the substrate at the time of development, and stains or film residues are readily produced in an area other than a portion where pixels are formed.

The photosensitive resist composition of the present invention may further contain various additives as required.

The photosensitive resist composition of the present invention can contain a storage stabilizer for stabilizing the viscosity of the composition over time. Examples of the storage stabilizer include quaternary ammonium chlorides such as benzyltrimethyl chloride and diethylhydroxyamine, organic acids such as lactic acid and oxalic acid and methyl ether thereof, t-butylpyrocatechol, organic phosphines such as tetraethylphosphine and tetraphenylphosphine, and a salt of phosphorous acid. The storage stabilizer can be used by an amount of 0.1% to 10% based on the weight of the colorant.

Illustrative examples of the additives include dispersion aids for blue pigment derivative exemplified by copper phthalocyanine derivative and yellow pigment derivative; fillers such as glass and alumina; polymer compounds such as polyvinyl alcohol, polyethylene glycol moloalkyl ether and poly(fluoroalkylacrylate); surfactants such as nonionic surfactant, cationic surfactant and anionic surfactant; bond promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyl trimethoxysilane and 3-mercaptopropyltrimethoxysilane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; and agglomeration inhibitors such as sodium polyacrylate.

All the above components of the inventive photosensitive resist composition excluding the component (B) are generally dissolved in an appropriate solvent to prepare a liquid composition.

Any solvents are acceptable as long as they can disperse or dissolve and do not react with the components and the additives and have appropriate volatility.

Illustrative examples of the solvent include (poly)alkylene glycol monoalkyl ethers such as ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate and propylene glycol monoethyl ether acetate; other ethers such as diethylene glycol dimethyl ether, diethylene glycol methyl ethyl ether, diethylene glycol diethyl ether and tetrahydrofuran; ketones such as methyl ethyl ketone, cyclohexanone, 2-heptanone and 3-heptanone; alkyl lactates such as methyl 2-hydroxypropionate and ethyl 2-hydroxypropionate; other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-amyl acetate, i-amyl acetate, n-butyl propionate, ethyl butyrate, n-propyl butyrate, i-propyl butyrate, n-butyl butyrate, methylpyruvic acid, ethylpyruvic acid, n-propylpyruvic acid, methyl acetoacetate, ethyl acetoacetate and ethyl 2-oxobutyrate; aromatic hydrocarbons such as toluene and xylene;

carboxylic acid amides such as N-methylpyrrolidone, N,N-dimethylformamide, and N,N-dimethylacetoamide; and the like.

These solvents may be used alone or in admixture of two or more.

A high-boiling solvent such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, .gamma.-butyrolactone, ethylene carbonate, propylene carbonate and ethylene glycol monophenyl ether acetate can be used in combination with the solvent.

These high-boiling solvents may be used alone or in admixture of two or more.

Of the above solvents, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, ethyl 2-hydroxypropionate, 3-methyl-3-methoxybutyl propionate, ethyl 3-methoxypropionate, methyl 3-ethoxypropionate, ethyl 3-ethoxypropionate, n-butyl acetate, i-butyl acetate, n-amyl acetate, i-amyl acetate, n-butyl propionate, ethyl butyrate, i-propyl butyrate, n-butyl butyrate and ethylpyruvic acid are preferred from the viewpoint of solubility, pigment dispersibility and coating properties, and of the above high-boiling solvents, .gamma.-butyrolactone is preferred.

The amount of the solvent in the present invention is generally 100 to 10,000 parts by weight, preferably 500 to 5,000 parts by weight based on 100 parts by weight of the binder polymer (C).

The photosensitive composition of the present invention can be prepared in the form of a solvent developing type or alkali developing type colored resist. The resist can be prepared by dispersing the colorant such as a pigment, and the above-mentioned additional substances. It is preferable that large grains of 5 μm or more, preferably 1 μm or more and more preferably 0.5 μm or more and mixed dusts are removed by means of, e.g., centrifugal separation, a sintered filter or a membrane filter from the photosensitive composition of the present invention.

A third aspect of the invention is to provide a coating film. The coating film comprises a colored photosensitive resist composition comprising the binder polymer (C), the diacrylic monomer (A), the photopolymerization initiator (D) and the coloring agent (B) as described hereinbefore.

Preferably, the coloring agent (B) comprises a red pigment selected from the group consisting of C.I. Pigment Red 7, 9, 14, 41, 48:1, 48:2, 48:3, 48:4, 81:1, 81:2, 81:3, 97, 122, 123, 146, 149, 168, 177, 178, 180, 184, 185, 187, 192, 200, 202, 208, 210, 215, 216, 217, 220, 223, 224, 226, 227, 228, 240, 246, 254, 255, 264 or 272 or a mixture thereof. The preferred content of the red pigment in the coating film is 0.02 to 1.5 g/m$^2$.

Also preferred is a coating film wherein the coloring agent comprises a green pigment selected from the group consisting of C.I. Pigment Green 7, 10, 36 or 37 or a mixture thereof and wherein the content of the green pigment in the coating film is 0.02 to 1.5 g/m$^2$.

Likewise preferred is a coating film wherein the coloring agent comprises a blue pigment selected from the group consisting of C.I. Pigment Blue 1, 15, 15:1, 15:2, 15:3, 15:4, 15:6, 16, 22, 60 or 64 or a mixture thereof and wherein the content of the blue pigment in the coating film is 0.02 to 1.5 g/m$^2$.

A third aspect of the invention is to provide a color filter. The color filter of the present invention has at least one filter segment which is formed using the photosensitive composition of the present invention. The color filter includes an additive mixture type which comprises at least one red filter segment, at least one green filter segment and at least one blue filter segment, and a subtractive mixture type which comprises at least one magenta filter segment, at least one cyan filter segment and at least one yellow filter segment. The pigments respectively used for a red colored photosensitive composition which forms the red filter segment, a green colored photosensitive composition which forms the green filter segment and a blue colored photosensitive composition which forms the blue filter segment are already described. Similarly, the pigments respectively used for a magenta colored photosensitive composition which forms the magenta filter segment, a cyan colored photosensitive composition which forms the cyan filter segment and a yellow colored photosensitive composition which forms the yellow filter segment are already described.

Preferably, the inventive color filter comprises a red photosensitive resist layer, a green photosensitive resist layer, and a blue photosensitive resist layer; wherein (i) the red photosensitive resist layer comprises the coating film as described hereinbefore wherein the coloring agent (B) comprises a red pigment selected from the group consisting of C.I. Pigment Red 7, 9, 14, 41, 48:1, 48:2, 48:3, 48:4, 81:1, 81:2, 81:3, 97, 122, 123, 146, 149, 168, 177, 178, 180, 184, 185, 187, 192, 200, 202, 208, 210, 215, 216, 217, 220, 223, 224, 226, 227, 228, 240, 246, 254, 255, 264 or 272 or a mixture thereof and wherein the content of the red pigment in the coating film is 0.02 to 1.5 g/m$^2$;

(ii) the green photosensitive resist layer comprises the coating film as described hereinbefore wherein the coloring agent (B) comprises a green pigment selected from the group consisting of C.I. Pigment Green 7, 10, 36 or 37 or a mixture thereof and wherein the content of the green pigment in the coating film is 0.02 to 1.5 g/m$^2$; and (iii) the blue photosensitive resist layer comprises the coating film as described hereinbefore wherein the coloring agent (B) comprises a blue pigment selected from the group consisting of C.I. Pigment Blue 1, 15, 15:1, 15:2, 15:3, 15:4, 15:6, 16, 22, 60 or 64 or a mixture thereof and wherein the content of the blue pigment in the coating film is 0.02 to 1.5 g/m$^2$.

A fourth aspect of the invention is to provide a method for producing a color filter. The method comprises the steps of: (a) forming a photosensitive resist layer; (b) exposing the photosensitive resist layer; and (c) developing the photosensitive resist layer; wherein the photosensitive resist layer comprises the photosensitive resist composition as described hereinbefore.

The color filter of the present invention can be prepared by forming respective filter segments on a transparent substrate using the photosensitive composition of the present invention by a photolithographic method.

As the transparent substrate, a glass plate or a resin plate such as a polycarbonate, a polymethyl methacrylate and a polyethylene terephthalate can be used.

The formation of the respective color filter segments by the photolithographic method can be carried out by the following method. That is, the photosensitive composition prepared in the form of a solvent developing type or alkali developing type colored resist is coated on a transparent substrate by a coating method such as spray coating, spin coating, slit coating or roll coating to a thickness of 0.2 to 5 μm when dried. Then, ultraviolet exposure is carried out on the dried coating through a mask having a predetermined pattern provided on the coating in a contact or non-contact state. Then, the uncured portion is removed by immersing the coating in a solvent or alkali developing liquid or by spraying the developing liquid with, e.g., a spray onto the coating. Similar operations are repeated for other colors, preparing the color filter. The photolithographic method can produce color filters having higher precision than those produced by a printing method.

As the alkali developing liquid, an aqueous solution of, e.g., sodium carbonate or sodium hydroxide can be used. Also, an organic alkali such as dimethylbenzylamine or triethanolamine can be used. An anti-foaming agent or a surfactant can be added to the developing liquid.

Further, ultraviolet exposure can be also carried out after coating a water-soluble or alkali-soluble resin, such as a polyvinyl alcohol or a water-soluble acrylic resin.sub.o on the coated and dried colored resist, and drying the coated resin to form a film which prevents polymerization inhibition caused by oxygen, in order to increase the sensitivity of ultraviolet exposure.

A more detailed description of a method of forming a color filter using the photosensitive resist composition of the present invention is subsequently given.

A light screening layer is first formed to define a portion for forming pixels on the surface of a transparent substrate. A liquid photosensitive resist composition having, for example, a red pigment dispersed therein is coated on this substrate to form a coating film. Thereafter, the coating film is exposed to radiation through a photomask and developed with an alkali developer to dissolve and remove unexposed portions of the coating film to form an array of red pixels arranged in a predetermined pattern.

Thereafter, liquid photosensitive resist compositions having green and blue pigments dispersed therein are coated, exposed and developed in the same manner as described above to form arrays of green pixels and blue pixels on the same substrate sequentially. Thus, a color filter having arrays of three red, green and blue pixels arranged on the substrate is obtained.

The transparent substrate used to form the color filter is made from glass, silicon, polycarbonate, polyester, aromatic polyamide, polyamideimide, polyimide or the like. The transparent substrate can be subjected to a suitable pre-treatment such as chemical treatment with a silane coupling agent or the like, plasma treatment, ion plating, sputtering, gas vapor reaction process or vacuum vapor deposition.

To coat the liquid radiation sensitive composition on the transparent substrate, rotation coating, cast coating, roll coating or the like can be suitably employed.

The thickness of the coating film after drying is generally 0.1 to 10 µm, preferably 0.2 to 5.0 µm, particularly preferably 0.2 to 3.0 µm.

The radiation used to form a color filter is selected from visible light, ultraviolet light, far ultraviolet light, electron beams, X-rays and the like. It preferably has a wavelength of 190 to 450 nm.

The irradiation energy of the radiation is preferably 1 to 1,000 mJ/cm$^2$.

The alkali developer is preferably an aqueous solution of sodium carbonate, sodium hydroxide, potassium hydroxide, tetramethyl ammonium hydroxide, choline, 1,8-diazabicyclo-[5.4.0]-7-undecene, 1,5-diazabicyclo-[4.3.0]-5-nonene or the like.

The alkali developer may contain a water-soluble organic solvent such as methanol or ethanol and a surfactant in suitable amounts. The alkali developer is generally washed off with water.

Development is carried out by shower development, spray development, dip development, puddle development or the like at normal temperature for 5 to 300 seconds.

The thus formed color filter which is also an aspect of the present invention is extremely useful for color liquid crystal display devices, color image pick-up elements, color sensors and the like.

The use of the thus formed color filter in an electronic paper display device is especially preferred. Further, it is another aspect of the present invention to provide an electronic paper display device comprising at least one of the thus formed color filters.

As described hereinbefore, the photosensitive resist composition is particularly suitable for the manufacture of color filter in connection with low temperature substrates and/or displays, e.g. electronic paper.

In principle, however, every flexible display, making use of other substrates than glass has a need for a low temperature color filter method. New upcoming techniques that don't need patterning, like inkjet, direct printing etc also need to cure the coated pixels (solvent removal, hardening etc). For example inkjet often makes use of radiation curing in stead of thermal curing (see for example, Yoshihiro et al. JP 2002-371216). For these techniques, the inventive diacrylate monomers also provide for strong advantages.

Hence, a preferred embodiment of the present invention relates to methods of printing filter material to fabricate a color filter using the inventive photosensitive resist composition described hereinbefore. It finds particular application in conjunction with printing the red, green, and blue filter material to fabricate a color filter for a display, such as a liquid crystal display (LCD). However, it is to be appreciated that the inventive methods are also amenable to fabrication of color filters for other types of displays, display devices, and like applications.

Accordingly, it is an object to fabricate a color filter for use in a liquid crystal or similar display by providing a means to successfully use an ink-jet printing system to deposit colored inks in a predetermined position by using a physical barrier to prevent flow of the ink from the designated cell to which it is delivered. Colored inks can be deposited in a very precise manner by an in-jet process or through a photocopy-like process where either colored thermoplastic or wax is delivered onto the substrate (since the resolution of these devices is greater than the requirements for a color filter). It is ensured that a background is fully saturated with color and that there is a good progression from one color dot to the next to make a smooth transition in color. The colors remain separated and pure, with sharp transitions between each color and the black matrix.

By using a lithographic step or a high resolution printing step to place a raised black mask onto a glass or polymeric sheet, a dam can in effect be formed to contain the ink or toner. The color filter is then "printed" using an inkjet or laser printer mechanism. Using a process such as this, only one lithographic step is required which provides the alignment marks, etc. and also acts to prevent the mixing of colors to ensure a pure color and very clean distinction between colors. It is important that for this process to work effectively, the thickness of the black matrix (mask) must be significantly thicker than is found in current LCD's. A physical barrier can mean any means to prevent the motion of a liquid and can include a dam, a surface wetting phenomena, etc. It is important to note that this invention will be effective for future pixel sizes for LCD's.

The following examples are provided for the purpose of further illustrating the present invention but are in no way to be taken as limiting.

EXAMPLES

Tests were done with a non-cured sample in the solvent of the photo resist, Propylene glycol monomethyl ether acetate (PGMEA), in an ultrasonic bath at room temperature. Standard resists were almost completely destroyed after 15 minutes. The resist according to the present invention showed only minor damages after 2 hrs in the ultrasonic bath.

As additional proof, a complete color filter was prepared that was exposed at 90° C. as the maximum temperature.

Example 1

One gram of Irgaphor red BT-CF was mixed with 1 gram of EFKA 4340, 3.2 grams of a 25% solution of a generic binder (copolymer of methacrylic acid and an aromatic Methacrylate) in PGMEA and 7 grams of PGMEA. 30 grams of zircon beads were added and the mixture was shaken in a Skandex for at least 5 hours. After this the beads were separated and 1 gram of glycerol 1,3-diglycerolate diacrylate (GDDA; Aldrich), 3 grams of PGMEA and 0.1 gram of Irgacure 369 were added. This mixture was spun on a polyethylene (PE) substrate with 800 rpm for 30 seconds in an open spin coater and air-dried.

The dried substrate was exposed with UV light of a high pressure Tungsten lamp, through a photo mask. The amount of UV light was 20-40 mJ/cm$^2$. The exposed substrate was developed in a mixture of TMAH (tetra methoxy-ammonium hydroxide, 0.125 M) and a surfactant (0.5%) in water, for about 60 seconds and thoroughly rinsed with water.

Example 2

Comparative Example

The whole process as described in Example 1 was repeated with the exception that GDDA was replaced by di(pentaerythritol) pentaacrylate. (Dipetia, Sartomer 399, Sartomer)

Example 3

The two substrates from Examples 1 and 2 were placed in a beaker filled with PGMEA. This beaker was placed in an ultrasonic bath and ultrasonic-treated for 15 minutes. The substrate of Example 1 didn't show any changes. The pattern on the substrate of Example 2 was almost completely removed.

Example 4

Example 3 was repeated but now after 2 hrs.

The pattern on the substrate of Example 1 showed some damage. About 10 to 15% of the pattern was destroyed. The pattern on the substrate of Example 2 was completely removed. The substrate was clean.

Example 5

Example 1 was repeated but the Irgaphor red BT-CF was replaced by 0.9 gram of a PB15:6 and 0.1 gram of PV23. The EFKA 4340 was replaced by Disperbyk 161 (30%, 1.5 gram). The resultant photo resist was applied on top of the red substrate from Example 1, prebaked at 90° C. for 3 minutes and exposed with about 100 mJ/cm$^2$. The development time was about 45 seconds.

Example 6

Example 1 was repeated but the Irgaphor red BT-CF was replaced by 0.6 gram of PG 36 and 0.4 gram of a greenish yellow pigment. The EFKA 4340 was replaced by 0.5 gram of Solsperse 24'000. The amount of starting PGMEA was 9 grams. The resulting pigmented photo resist was coated on the Red+Blue pattern of example 5. The prebake at 90° C. was done for 3 minutes. The developer was diluted 1 to 1 with water (0.063% TMAH and 0.25% surfactant). The development time was approximately 60 seconds.

The result was a complete red, green, blue colour filter with well-defined pixels. No damage of the red and blue pixels could be observed after the development of the green photo resist.

Typical Procedure for Diacrylate Monomer Synthesis:

Glycol-diglycidyl ether diacrylate monomers were synthesized from the corresponding diglycidyl ethers and acrylic acid. In a typical procedure a mixture of acrylic acid (1 mole), diglycidyl ether (0.5 mole), polymerization inhibitor and catalyst is reacted at 80-110° C. for several hours until complete disappearance of the reactants. The advancement of the reaction is monitored by GC or HPLC. A variety of catalysts may be used such as triethylamine, dimethylaniline, boron trifluoride, triphenyl phosphine, various metal salts, or any other epoxide ring-opening catalysts well known to those skilled in the art. The catalyst may be added all at once at the beginning of the reaction, or it may be added continuously or in increments over regular intervals during the reaction. Inhibitors are used to prevent undesired polymerization of the acrylates. Examples include for instance, hydroquinones, hydroquinone ethers such as hydroquinone monomethyl ether, di-tert-butylpyrocatechol, phenothiazine, p-phenylenediamine, Methylene Blue, sterically hindered phenols, and nitroxyls such as TEMPO, and are widely known among those skilled in the art. The proportion of inhibitors individually or as a mixture can generally range from about 0.01 to about 1% weight relative to the weight of the entire reaction mixture.

Example 7

The formulation of Example 1 was diluted with 45 g of methyl ethyl ketone (MEK). In stead of MEK solvents like PGMEA or cyclohexanone or the like, are also possible. The resulting solution was used for an inkjet experiment. Droplets were pattern wise deposited on a PET foil with an inkjet head from Fujifilm Dimatix, followed by a UV cure.

As can be taken from the photograph shown in FIG. 1, black squares form the target area and the gray dots are the inkjet droplets.

The invention claimed is:

1. A photosensitive resist composition for forming a color filter comprising:
   (A) a diacrylate monomer,
   (B) a colorant selected from the group consisting of an organic pigment and carbon black;
   (C) a binder polymer comprising a copolymer of an ethylenically unsaturated monomer having at least one carboxyl group and other copolymerizable ethylenically unsaturated monomers, wherein the proportion of the carboxyl group-containing unsaturated monomer in said copolymer is of from 5 to 50 wt %; and (D) a photopolymerization initiator;

wherein (A) is of formula (II)

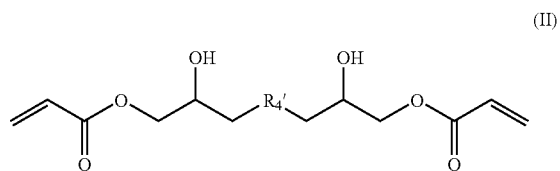

wherein $R_4'$ is $C_1$-$C_{18}$alkylene which can be substituted by E and/or interrupted by D;

D is —S— or —O—;

E is —$OR^5$ or —$SR^5$; and $R^5$ is H, wherein the photosensitive resist composition comprises the binder polymer (C) in an amount of 10 to 1,000 parts by weight based on 100 parts by weight of the colorant (B), the diacrylate monomer (A) in an amount of 5 to 500 parts by weight based on 100 parts by weight of the binder polymer (C), and the photopolymerization initiator (D) in an amount of 0.01 to 200 parts by weight based on 100 parts by weight of the total of the diacrylate monomer (A), and wherein the photosensitive resist composition is used for forming the color filter.

2. The photosensitive resist composition of claim 1 wherein the diacrylate monomer (A) is selected from the group consisting of:

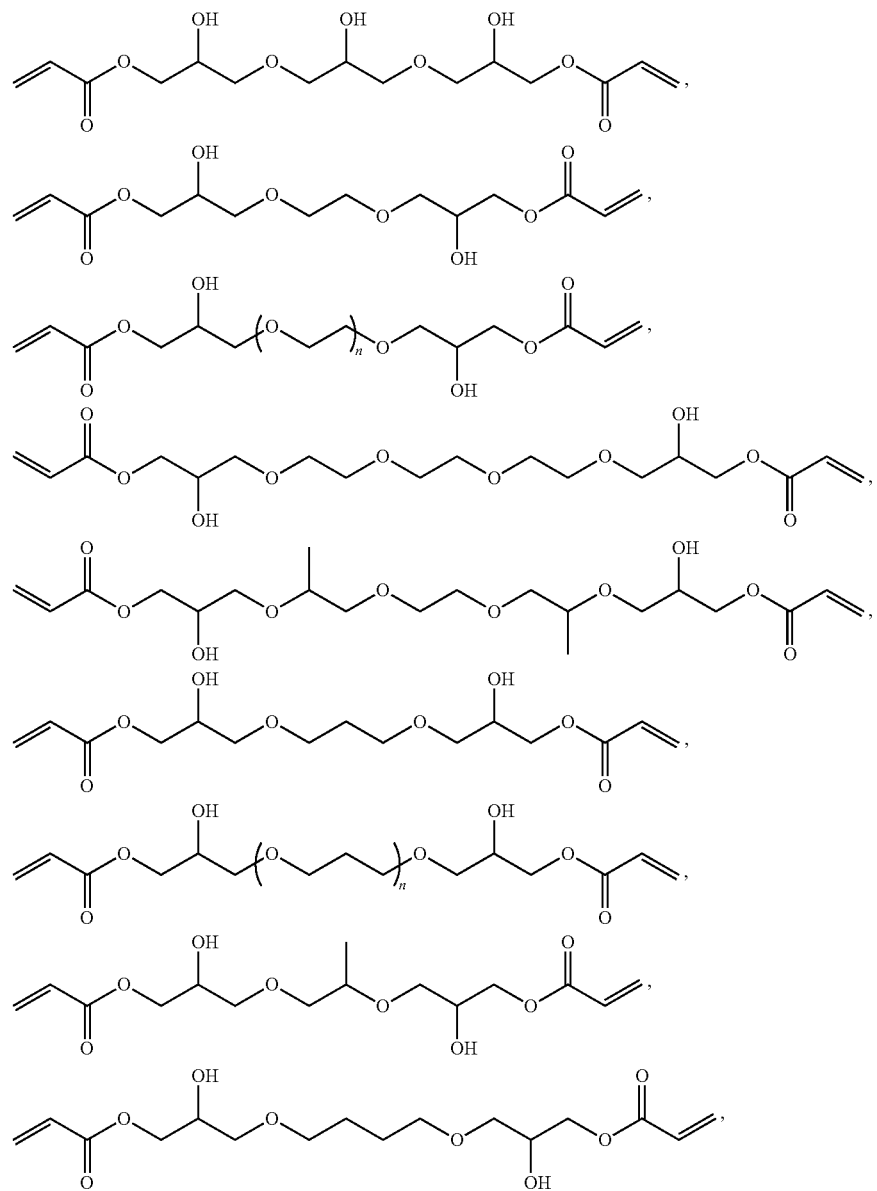

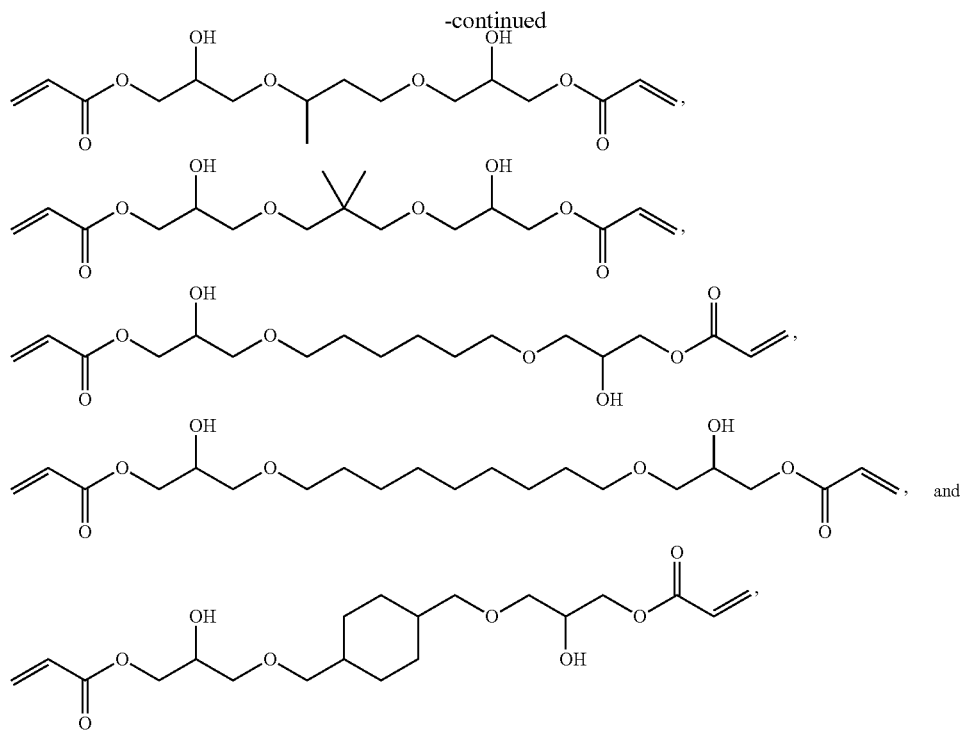

wherein n is an integer of from 1 to 10.

3. A coating film of a photosensitive resist composition according to claim 1 comprising a binder polymer, the diacrylic monomer of formula (II), a photopolymerization initiator, and a coloring agent; wherein the coloring agent is selected from the group consisting of C.I. Pigment Red 7, 9, 14, 41, 48:1, 48:2, 48:3, 48:4, 81:1, 81:2, 81:3, 97, 122, 123, 146, 149, 168, 177, 178, 180, 184, 185, 187, 192, 200, 202, 208, 210, 215, 216, 217, 220, 223, 224, 226, 227, 228, 240, 246, 254, 255, 264, 272, and a mixture thereof; wherein the amount of the coloring agent in the coating film is 0.02 to 1.5 g/m².

4. A coating film of a photosensitive resist composition according to claim 1 comprising a binder polymer, the diacrylic monomer of formula (II), a photopolymerization initiator, and a coloring agent; wherein the coloring agent is selected from the group consisting of C.I. Pigment Green 7, 10, 36, 37, and a mixture thereof; wherein the amount of the coloring agent in the coating film is 0.02 to 1.5 g/m².

5. A coating film of a photosensitive resist composition according to claim 1 comprising a binder polymer, the diacrylic monomer of formula (II), a photopolymerization initiator, and a coloring agent; wherein the coloring agent is selected from the group consisting of C.I. Pigment Blue 1, 15, 15:1, 15:2, 15:3, 15:4, 15:6, 16, 22, 60, 64, and a mixture thereof; wherein the amount of the coloring agent in the coating film is 0.02 to 1.5 g/m².

6. A method for producing a color filter, the method comprising: forming a photosensitive resist layer; exposing the photosensitive resist layer and developing the photosensitive resist layer, wherein the photosensitive resist layer comprises the photosensitive resist composition of claim 1.

7. The method for producing a color filter of claim 6 wherein the photosensitive resist layer is deposited by a printing technology.

8. A color filter produced by the method of claim 6.

9. An electronic paper display device comprising the color filter of claim 8.

* * * * *